(12) United States Patent
Rijshouwer et al.

(10) Patent No.: US 9,058,108 B2
(45) Date of Patent: Jun. 16, 2015

(54) VECTOR-BASED MATCHING CIRCUIT FOR DATA STREAMS

(75) Inventors: Erik Rijshouwer, Eindhoven (NL); Cornelis Van Berkel, Heeze (NL)

(73) Assignee: ERICSSON MODEMS SA, Plan-les-Ouates (CH)

( * ) Notice: Subject to any disclaimer, the term of this patent is extended or adjusted under 35 U.S.C. 154(b) by 167 days.

(21) Appl. No.: 13/992,837

(22) PCT Filed: Dec. 16, 2011

(86) PCT No.: PCT/EP2011/073098
§ 371 (c)(1),
(2), (4) Date: Jun. 29, 2013

(87) PCT Pub. No.: WO2012/080484
PCT Pub. Date: Jun. 21, 2012

(65) Prior Publication Data
US 2013/0305001 A1    Nov. 14, 2013

Related U.S. Application Data

(60) Provisional application No. 61/432,824, filed on Jan. 14, 2011.

(30) Foreign Application Priority Data

Dec. 17, 2010  (EP) .................................. 10195792

(51) Int. Cl.
*G06F 3/00* (2006.01)
*G06F 3/06* (2006.01)
(Continued)

(52) U.S. Cl.
CPC .......... *G06F 3/0604* (2013.01); *G06F 12/0607* (2013.01); *H03M 13/2757* (2013.01); *H03M 13/276* (2013.01); *G06F 3/0656* (2013.01); *G06F 3/0671* (2013.01)

(58) Field of Classification Search
CPC ... G06F 3/0604; G06F 3/0671; G06F 3/0656; G06F 3/06; G06F 17/06
See application file for complete search history.

(56) References Cited

U.S. PATENT DOCUMENTS 5,134,695 A * 7/1992 Ikeda ................................ 711/5
5,226,135 A   7/1993 Mishina et al.
(Continued)

FOREIGN PATENT DOCUMENTS

EP    0 282 070 A2    9/1988
WO    2009106540 A1   9/2009

OTHER PUBLICATIONS

International Search Report issued in corresponding International application No. PCT/EP2011/073098, date of mailing Mar. 13, 2012.
(Continued)

*Primary Examiner* — Idriss N Alrobaye
*Assistant Examiner* — Ronald Modo
(74) *Attorney, Agent, or Firm* — Patent Portfolio Builders PLLC

(57) ABSTRACT

Systems and methods are described relating to a matcher that inputs partial vectors at a rate of 1 per clock cycle and delivers complete vectors at the output with an indication per vector of its validity. The matcher can copy a maximum number of valid elements from an input queue to target vector in-order each clock cycle and eliminate copied elements from the input queue. The completely filled target vectors are paired with the complete data vectors and outputted as composite vectors.

15 Claims, 12 Drawing Sheets

(51) Int. Cl.
*G06F 12/06* (2006.01)
*H03M 13/27* (2006.01)

(56) References Cited

U.S. PATENT DOCUMENTS

| | | | |
|---|---|---|---|
| 5,822,557 A * | 10/1998 | Suetake et al. | 712/212 |
| 6,434,587 B1 | 8/2002 | Liao et al. | |
| 7,116,663 B2 | 10/2006 | Liao | |
| 2009/0300310 A1 * | 12/2009 | Van Berkel | 711/165 |
| 2010/0049951 A1 | 2/2010 | Gonion et al. | |
| 2011/0066821 A1 | 3/2011 | Rijshouwer et al. | |
| 2011/0078360 A1 | 3/2011 | Rijshouwer et al. | |

OTHER PUBLICATIONS

Christopher Francis Batten, "Simplified Vector-Thread Architectures for Flexible and Efficient Data-Parallel Accelerators," Massachusetts Institute of Technology, Feb. 2010.

* cited by examiner

| t = 0 | t = 1 | t = 2 | t = 3 | t = 4 |
|---|---|---|---|---|
| $6_6$ 6 | $7_2$ 8 | $8_3$ 8 | $4_3$ 8 | $6_6$ 7 |
| -     | -       | $5_5$   | $5_5$   | $1_1$   |

| t = 5 | t = 6 | t = 7 | t = 8 | t = 9 |
|---|---|---|---|---|
| $5_1$ 8 | $8_4$ 8 | $4_4$ 8 | $3_3$ 3 | 3 |
| -       | $4_4$   | $4_4$   | -       | - |

| Example inputs offered to Address and data matcher | | |
|---|---|---|
| Time | Vectors | Valids |
| 0 | a0,a1,a2,a3,a4,a5,a6,a7 | 01011101 |
| 1 | b0,b1,b2,b3,b4,b5,b6,b7 | 11010100 |
| 2 | c0,c1,c2,c3,c4,c5,c6,c7 | 11111111 |
| 3 | d0,d1,d2,d3,d4,d5,d6,d7 | 00101100 |
| 4 | e0,e1,e2,e3,e4,e5,e6,e7 | 00001000 |
| 5 | f0,f1,f2,f3,f4,f5,f6,f7 | 01010100 |
| Etc.... | Etc.... | Etc... |

FIG. 5A

| Time = 1 | Vector (i) valids | Vector (i+1) valids | | Vector (i) | Vector (i+1) |
|---|---|---|---|---|---|
| | 11111000 | 11010100 | | a1,a3,a4,a5,a7,·,·,· | b0,b1,b2,b3,b4,b5,b6,b7 |
| Vector window | 1111100011010100 | | | a1,a3,a4,a5,a7,·,·,·,b0,b1,b2,b3,b4,b5,b6,b7 | |
| 1st Occ | 1000000000000000 | | 1-hot M1 | a1 | |
| 2nd Occ | 0100000000000000 | | 1-hot M2 | a3 | |
| 3rd Occ | 0010000000000000 | | 1-hot M3 | a4 | |
| 4th Occ | 0001000000000000 | | 1-hot M4 | a5 | |
| 5th Occ | 0000100000000000 | | 1-hot M5 | a7 | |
| 6th Occ | 0000000100000000 | | 1-hot M6 | b0 | |
| 7th Occ | 0000000001000000 | | 1-hot M7 | b1 | |
| 8th Occ | 0000000000010000 | | 1-hot M8 | b3 | |
| Valid mask | 1111100011010000 | | | | |
| Masked valids | 00000100 | | | | |
| Feedback | 11111111 | | Feedback / Output | a1,a3,a4,a5,a7,b0,b1,b3 | |
| | | | Valid | 1 | |

FIG. 5C

| Time = 2 | Vector (i) valids | Vector (i+1) valids | | Vector (i) | Vector (i+1) |
|---|---|---|---|---|---|
| Vector window | 00000100111111111 | | | b0,b1,b2,b3,b4,b5,b6,b7 | c0,c1,c2,c3,c4,c5,c6,c7 |
| 1st Occ | 0000010000000000 | 11111111 | | b0,b1,b2,b3,b4,b5,b6,b7,c0,c1,c2,c3,c4,c5,c6,c7 | c0,c1,c2,c3,c4,c5,c6,c7 |
| 2nd Occ | 0000000010000000 | | 1-hot M1 | b5 | |
| 3rd Occ | 0000000001000000 | | 1-hot M2 | c0 | |
| 4th Occ | 0000000000100000 | | 1-hot M3 | c1 | |
| 5th Occ | 0000000000010000 | | 1-hot M4 | c2 | |
| 6th Occ | 0000000000001000 | | 1-hot M5 | c3 | |
| 7th Occ | 0000000000000100 | | 1-hot M6 | c4 | |
| 8th Occ | 0000000000000010 | | 1-hot M7 | c5 | |
| | | | 1-hot M8 | c6 | |
| Valid mask | 0000010011111110 | | | | |
| Masked valids | 00000001 | | Feedback / Output | b5,c0,c1,c2,c3,c4,c5,c6 | |
| Feedback | 11111111 | | Valid | 1 | |

FIG. 5D

| Time = 3 | Vector (i) valids | Vector (i+1) valids | | Vector (i) | Vector (i+1) |
|---|---|---|---|---|---|
| Vector window | 00000001 | 00101100 | | c0,c1,c2,c3,c4,c5,c6,c7 | d0,d1,d2,d3,d4,d5,d6,d7 |
| 1st Occ | 0000000100101100 | | | c0,c1,c2,c3,c4,c5,c6,c7,d0,d1,d2,d3,d4,d5,d6,d7 | |
| 2nd Occ | 0000000100000000 | | 1-hot M1 | c7 | |
| 3rd Occ | 0000000000100000 | | 1-hot M2 | d2 | |
| 4th Occ | 0000000000001000 | | 1-hot M3 | d4 | |
| 5th Occ | 0000000000000100 | | 1-hot M4 | d5 | |
| 6th Occ | 0000000000000000 | | 1-hot M5 | . | |
| 7th Occ | 0000000000000000 | | 1-hot M6 | . | |
| 8th Occ | 0000000000000000 | | 1-hot M7 | . | |
|  | 0000000000000000 | | 1-hot M8 | . | |
| Valid mask | 0000000100101100 | | | | |
| Masked valids | 11110000 | | Feedback / Output | c7,d2,d4,d5,·,·,·,· | |
| Feedback | | | Valid | 0 | |

FIG. 5E

| Time = 4 | Vector (i) valids | Vector (i+1) valids | | Vector (i) | Vector (i+1) |
|---|---|---|---|---|---|
| | 11110000 | 00001000 | | c7,d2,d4,d5,-,-,-,- | e0,e1,e2,e3,e4,e5,e6,e7 |
| Vector window | 1111000000001000 | | | c7,d2,d4,d5,-,-,-,e0,e1,e2,e3,e4,e5,e6,e7 | |
| 1st Occ | 1000000000000000 | | 1-hot M1 | c7 | |
| 2nd Occ | 0100000000000000 | | 1-hot M2 | d2 | |
| 3rd Occ | 0010000000000000 | | 1-hot M3 | d4 | |
| 4th Occ | 0001000000000000 | | 1-hot M4 | d5 | |
| 5th Occ | 0000000000001000 | | 1-hot M5 | e4 | |
| 6th Occ | 0000000000000000 | | 1-hot M6 | - | |
| 7th Occ | 0000000000000000 | | 1-hot M7 | - | |
| 8th Occ | 0000000000000000 | | 1-hot M8 | - | |
| Valid mask | 1111XXXX00001000 | | | | |
| Masked valids | 00000000 | | Feedback / Output | c7,d2,d4,d5,e4,-,-,- | |
| Feedback | 11111000 | | Valid | 0 | |

| Time = 5 | Vector (i) valids | Vector (i+1) valids | | | Vector (i) | Vector (i+1) |
|---|---|---|---|---|---|---|
| | 11111000 | 01010100 | | | c7,d2,d4,d5,e4,·,·,· | 10,11,12,13,14,15,16,17 |
| Vector window | 111111000101010100 | | | | c7,d2,d4,d5,e4,·,·,·,10,11,12,13,14,15,16,17 | |
| 1st Occ | 100000000000000000 | | | 1-hot M1 | c7 | |
| 2nd Occ | 010000000000000000 | | | 1-hot M2 | d2 | |
| 3rd Occ | 001000000000000000 | | | 1-hot M3 | d4 | |
| 4th Occ | 000100000000000000 | | | 1-hot M4 | d5 | |
| 5th Occ | 000010000000000000 | | | 1-hot M5 | e4 | |
| 6th Occ | 000000001000000000 | | | 1-hot M6 | f1 | |
| 7th Occ | 000000000010000000 | | | 1-hot M7 | f3 | |
| 8th Occ | 000000000000000100 | | | 1-hot M8 | f5 | |
| Valid mask | 111111000101010100 | | | Feedback/ Output | c7,d2,d4,d5,e4,f1,f3,f5 | |
| Masked valids | 00000000 | | | Valid | 1 | |
| Feedback | 11111111 | | | | | |

VECTOR-BASED MATCHING CIRCUIT FOR DATA STREAMS

The present invention relates to methods and devices for address vector matching, e.g. for application in data block reordering according to a specific permutation such as can be found in interleaving, de-interleaving, shuffling, de-shuffling, and scrambling or de-scrambling processes as well as to devices such as telecommunication devices and methods making use of address vector matching, e.g. for application in data block reordering according to a specific permutation and to computer program products that implement such methods when executed on a processing engine.

TECHNICAL BACKGROUND

At least one interleaving step, for example data block reordering according to a specific permutation, is required in many telecommunications protocols and hence there has been a trend such that an interleaving step is to be found in virtually every radio processing chain.

Another more recent trend is to provide telecommunications devices such as mobile phones that are adapted to use various standards. Processing of received signals is typically standard specific and hence there are demands on the interleaving architectures of a telecommunication device for it to be adapted to different standards or to be re-configurable to one or more different standards.

The ever increasing throughput demands for interleaving architectures typically lead to multi-bank memory solutions. In order to address multiple memory banks simultaneously, a vector processor is preferably incorporated as a vector address generator. Ideally, a full vector of P addresses is produced by this vector address generator every clock cycle, when there are P data elements stored in memory. Because of their characteristics, not all required address sequences allow for on-the-fly generation of P addresses at every clock cycle. This leads to a lower address vector rate and thus a lower multi-bank memory usage efficiency.

Known solutions for interleaving can be categorized as follows:
  Low-rate interleaving on microcontrollers or DSPs
    Addresses are generated sequentially and in general the efficiency of address generation is very low.
  High-rate interleaving on dedicated HW (hardware)
    Dedicated HW solutions have limited or no reconfigurability and are therefore not suitable for multi-standard interleaving.
  A related situation relates to high throughput interleaving in Turbo Decoders. Multi-bank interleaving solutions are available for this application, but are standard specific (i.e. they are not reconfigurable).
  High throughput requirements on interleavers have the following consequences:
    Data input and output, to and from the interleaver, typically needs to be done in parallel (i.e. multiple data elements at a time: data vectors)
    Processing P data elements simultaneously requires P addresses to be available each clock cycle.
  Look-up table solutions can provide P addresses each clock cycle, but the number of required tables grows enormously when the number of standards to be supported rises.

In the general case of multi-standard address generation, the goal of generating P addresses every clock cycle can typically be realized only partially. As a result there is less than P addresses per clock cycle. This leads to "partial address vectors", which are vectors that are not completely filled but contain less than P valid addresses.

SUMMARY OF THE INVENTION

There is a need for improved address generation approaches in relation to data re-ordering devices such as interleavers, de-interleavers, scramblers, de-scramblers, shufflers, de-shufflers.

An advantage of embodiments of the present invention is that they provide a solution to the address generation problem.

An advantage of embodiments of the present invention is that when partial address vectors (containing less than P valid addresses) are allowed, efficiency can be increased and the expressivity of the vector address generator is also increased (i.e. a larger number of possible address sequences can be generated).

Embodiments of the present invention enable high-rate data re-ordering such as interleaving, de-interleaving, scrambling, de-scrambling, shuffling, de-shuffling. which is/are also re-configurable to deal e.g. with different standards.

Embodiments of the present invention also provide systems and methods relating to a matcher that inputs partial vectors at a rate of 1 per clock cycle or slower and delivers complete vectors at the output with an indication per vector of its validity. For example, the matcher can copy a maximum number of valid elements from an input queue to target vector in-order each clock cycle and eliminates copied elements from the input queue. The completely filled target vectors are paired with the complete data vectors and outputted as composite vectors.

Matching operations of vectors can be utilised in different situations, e.g. in packet classification processes, for digital signal processing, for sorting vector data, telecom multi-standard address generation, etc.

Although in prior art systems partial address vectors cannot be used directly for multi-bank memory accesses, an advantage of embodiments of the present invention is that they may enable direct multi-bank memory access by filtering of partial address vectors for valid address vector elements so that complete address vectors may be obtained. In case of write accesses to the data memory, the complete address vectors may be matched with the corresponding data vectors and then the data can be output.

In particular the present invention provides a method of processing addresses for use in addressing a memory containing data to be reordered, the method comprising:
  storing a first at least partial address vector and first validity information indicating which elements of the first at least partial address vector are valid,
  receiving a sequence of address vectors comprising a second at least partial address vector and second validity information indicating which vector elements of the second at least partial address vector are valid,
  transferring a number of valid vector elements from the first and second at least partial address vectors to a target address vector while replacing the stored first at least partial address vector by storing any valid vector elements of the second at least partial address vector that have not been transferred, as the first at least partial address vector, and
  outputting the target address vector if all of the vector elements of the target vector are valid.

An advantage of the method is that as and when partial address vectors are allowed, efficiency can be increased.

In the method all valid elements from the first at least partial address vector can be transferred, while at least some of the valid elements from the second at least partial address vector are transferred. This provides a greater likelihood of obtain a completely valid target vector.

In the method one second at least partial address vector with its validity information indicating which vector elements of the second at least partial address vector are valid can be received per clock cycle. This allows rapid processing of the at least partial address vectors.

In embodiments of the present invention the validity information of the first and second at least partial address vectors for the address vector elements that are to be transferred to the output vector may be directly or indirectly OR-ed together to a single bit mask and the bit mask may be XORed with the validity information of the second at least partial address vector and the result stored as the validity information for the first at least partial address vector in the next cycle. In a preferred embodiment this result is only stored as the validity information for the first at least partial address vector when a full target vector has been assembled. If the vectors have P elements the bit mask is typically a P-bit mask. This allows the use of logic circuits which can operate at high speed.

In a specific embodiment of the present invention relating to indirect OR-ing the validity information that is output from logic elements such as occurrence checkers is OR-ed together to the single bit mask. These occurrence checkers use validity information of the first and second at least partial address vectors as input.

P is the number of elements in the address vector and this may be the same as the number of data elements which will be output as a data stream. However the present invention allows puncturing and padding so the number of data elements is/can be less or more than the full length of an address vector.

In the method, if all of the vector elements of the target address vector are valid, the vector elements of the second at least partial address vector can be stored as the first at least partial address vector for the next cycle. This increases the rate of data transfer.

In the method, if not all of the vector elements of the target address vector are valid, the bit mask, e.g. the P-bit mask can be used to select the vector elements of the second at least partial address vector that are stored as the first at least partial address vector for the next cycle. This allows a rapid way of selecting the valid elements of the second at least partial address vector.

In the method the validity information of the first and second at least partial address vectors for the vector elements that are to be transferred to the target address vector can be ANDed together and stored as validity information of the target address vector. This allows the validity of the target address vector to be determined.

In the method the data to be reordered can be reordered to a specific permutation. This allows adaptation of the method to different standards.

The present invention also provides computer program product comprising a computer readable medium, having thereon a computer program comprising program instructions, the computer program being loadable into a data-processing unit and adapted to cause the data-processing unit to execute the method described above when the computer program is run by the data-processing unit. The use of computer programs makes the method flexible so that it can be run on different operating systems and hardware.

The present invention also provides a logic circuit adapted to process addresses for use in addressing a memory containing data to be reordered, the circuit comprising:

a first and a second buffer adapted to store, respectively, a first at least partial address vector and first validity information indicating which elements of the first at least partial address vector are valid, a third and a fourth buffer adapted to store, respectively, a second at least partial address vector and second validity information indicating which vector elements of the second at least partial address vector are valid, a routing unit adapted to transfer a number of valid vector elements from the first and third buffers to a fifth buffer adapted to store a target address vector while storing any valid address vector elements from the third buffer that have not been transferred in the third buffer. The use of logic circuits allows rapid processing.

The logic circuit can be adapted to receive one at least partial address vector with its validity information indicating which vector elements of the one at least partial address vector are valid per clock cycle. This allows rapid processing as a single clock cycle is required.

The logic circuit may be adapted to OR together validity information of the first and second address vectors for the vector elements that are to be transferred to the output vector to a single mask and to XOR the single mask with the validity information of the second at least partial address vector and to store the result in the second buffer as the validity information for the first at least partial address vector for the next cycle. If the vectors have P elements the mask is a P-bit mask.

The use of OR and XOR processes allows the use of standard logic gates and the use of a single mask is efficient.

The logic circuit can be adapted to, if all of the vector elements of the target address vector are valid, store in the first buffer vector elements of the second at least partial address vector as the first at least partial address vector for the next cycle.

The logic circuit can also be adapted to, if all of the vector elements of the target address vector are not valid, use the mask such as the P-bit mask to select the vector elements of the second at least partial address vector and store them in the first buffer as the first at least partial address vector for the next cycle.

The routing unit can be adapted to AND together the validity information of the first and second at least partial address vectors for the vector elements that are to be transferred to the target address vector and to store these in a sixth buffer as validity information of the target address vector.

The routing unit can also be adapted to transfer all valid elements from the first at least partial address vector and to transfer at least some of the valid elements from the second at least partial address vector.

The present invention also provides an arrangement adapted to address a memory containing data to be reordered, the arrangement comprising:

an address generator adapted to provide at least partial address vectors;

and the logic circuit as described above. If required a conflict resolver for resolving conflicts when addressing the memory can be provided.

The present invention also provides a telecommunications device especially a wireless communication device comprising the above arrangement and a memory adapted to contain data to be reordered.

BRIEF DESCRIPTION OF THE DRAWINGS

Further objects, features and advantages of the invention will appear from the following detailed description of embodiments of the invention, with reference being made to the accompanying drawings, in which:

FIG. 3 illustrates the states of a vector-based matching circuit in accordance with some embodiments of the present invention at different times.

FIGS. 5A to 5G illustrate a process flow according to embodiments of the present invention which can be carried out for example with the circuit of FIG. 4.

DETAILED DESCRIPTION OF ILLUSTRATIVE EMBODIMENTS

Figure 1:
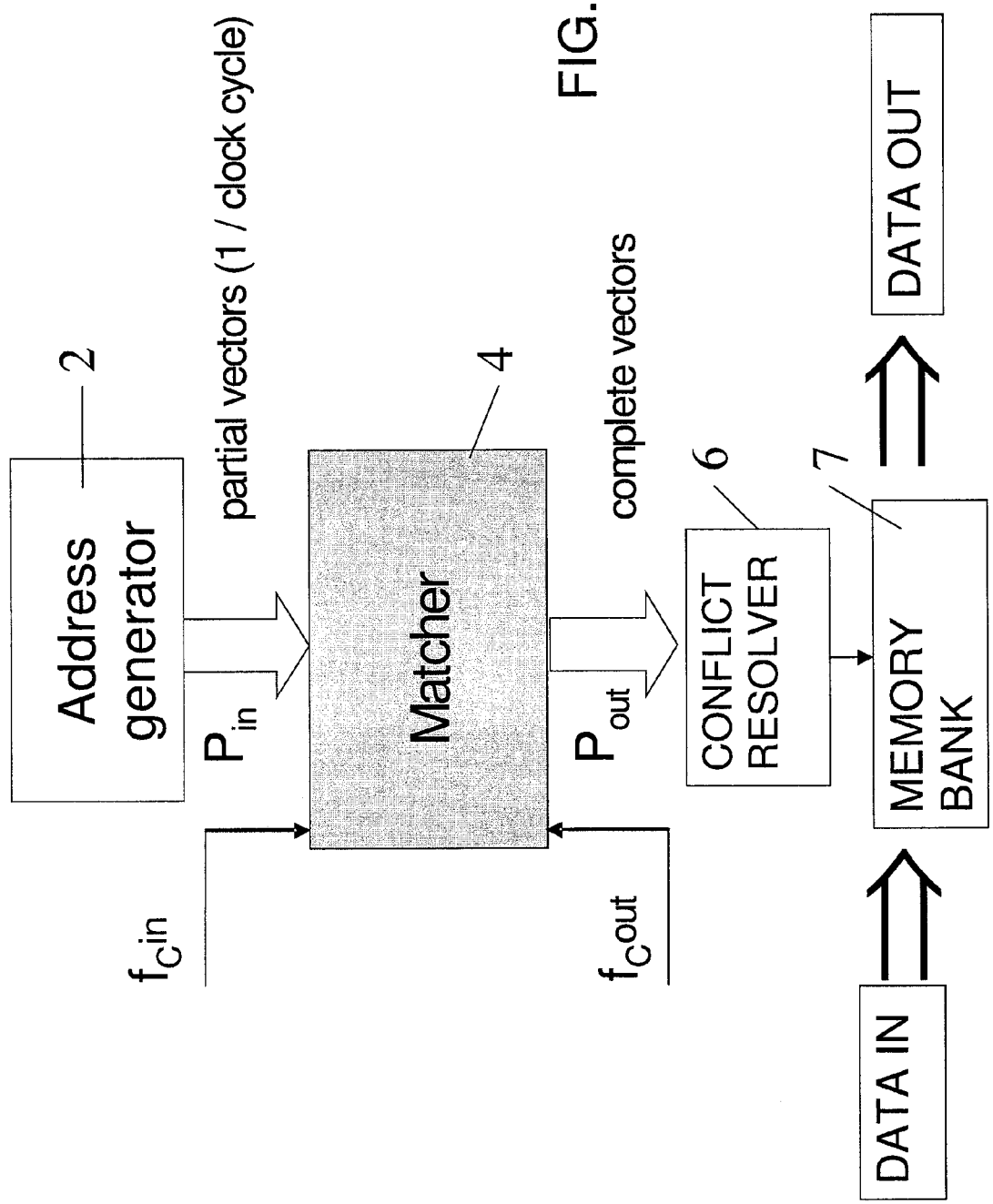
FIG. 1 shows a vector-based matching circuit in accordance with some embodiments of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Embodiments of the present invention relate to methods and devices in which there is data block reordering according to a specific permutation as used for example in an interleaving step in many telecommunications protocols such as used in cellular telephone networks, wireless Local Area Networks, satellite communications systems, television broadcast systems etc. In particular embodiments of the present invention provide address vector matching applicable in methods and devices for data block reordering according to a specific permutation such as interleaving for a radio processing chain, or such as used in telecommunications devices in general. The present invention may be used in telecommunications devices that are adapted to use various standards.

In a data block reordering according to a specific permutation such as an interleaving processing step, an initial set of values will be stored in a data memory in a first sequence and will be read from the data memory in another sequence. In this way the original sequence is scrambled, shuffled or interleaved. The data itself may be located in the data memory at respective addresses and then a sequence of output addresses is to be determined which is the correct sequence of output data in accordance with the specific permutation. Hence, embodiments of the present invention include methods and devices for determining memory addresses that are used to read out data in accordance with a predetermined data reordering. In particular, data banks can be used to store the data until it is read out. For accesses to a multi-bank memory, embodiments of the present invention combine at least partial address vectors with each other to form a full address vector. This leads to a need for matching.

A "partial address vector", is a vector whose elements are not completely valid. The phrase "at least partial address vector" is intended to covey the meaning that the address vector elements may be partially or completely valid. In a sequence of input address vectors at least some of them will be partial address vectors.

Embodiments of the present invention provide a matching circuit to solve the matching problem. The matching circuit 4 is shown schematically in FIG. 1. It inputs partial vectors from an address generator 2 at a rate, e.g. of 1 per clock cycle. The maximum width of these vectors is defined by $P_{in}$. For example there could be a maximum of 8 addresses in these vectors. It is envisaged that the scope of the present invention is not limited by the address generator which can be any suitable partial address generator. In particular embodiments of the present invention, the address generator may be any such generator adapted to generate partial addresses in an efficient manner for more than one standard. One advantage of using partial address generators is that the algorithms used for determining the addresses may be a) more efficient or less computationally intensive
   b) may allow a limited set of algorithms for generating the addresses while be suitable for more than one standard.

Thus one aspect of the present invention is to make efficient use of partial address generation while maintaining a high success rate in completing valid address data sequences.

At the output of the matching circuit 4, complete address vectors are delivered with an indication per vector of its validity. The maximum width of these output vectors is $P_{out}$. For example, vectors having a (maximum) width of 8 addresses could be output.

P is the number of elements in the address vector and this may be the same as the number of data elements which will be output. However the present invention allows puncturing and padding so the number of data elements is/can be less or more than the full length of an address vector.

Each vector is preferably delivered with an indicator of "vector valid". The vector valid indicator can be the absence of an indication whereas there is an indication if the vector is invalid. Alternatively, the vector invalid indicator can be the absence of an indication whereas there is an indication if the vector is valid. Alternatively, both the vector valid indicator and invalid indicator can be defined by the presence of different indications respectively. Thus, the vector valid indicator could be a bit having a Boolean value 1 or 0, and the invalid indicator would have the Boolean value 0 or 1, respectively.

As well as the widths of the input and output vectors, also the clock rates of input and output can differ. They are denoted respectively by $f_C$in and $f_C$out in FIG. 1.

The output of the matching circuit 4 can be fed to a conflict resolver 6 to resolve any conflicts in the memory addresses. The conflict resolver 6 is not considered as a limitation of the present invention. Its implementation lies outside the scope of the present invention. The data stored in memory bank 7 is then read out in accordance with the addresses received from the conflict resolver. The output of the matching circuit 4 does not exclude the option that data to be output from the memory bank 7 is, or is to be, punctured (i.e. certain data elements removed from the sequence), or is, or is to be, padded (i.e. data elements such as zeroes are added to the sequence), or is to be otherwise processed.

Thus, in accordance with embodiments of the present invention there is a mapping relationship between the input address data and the output address data, this relationship being in the form of a mapping which may be, for example, bijective, surjective or injective.

Matching circuit 4 copies a maximum number of valid vector address data elements in order from the input queue of address vectors to a target vector each clock cycle and eliminates the elements from the input queue that have been copied to the target vector.

Figure 2:
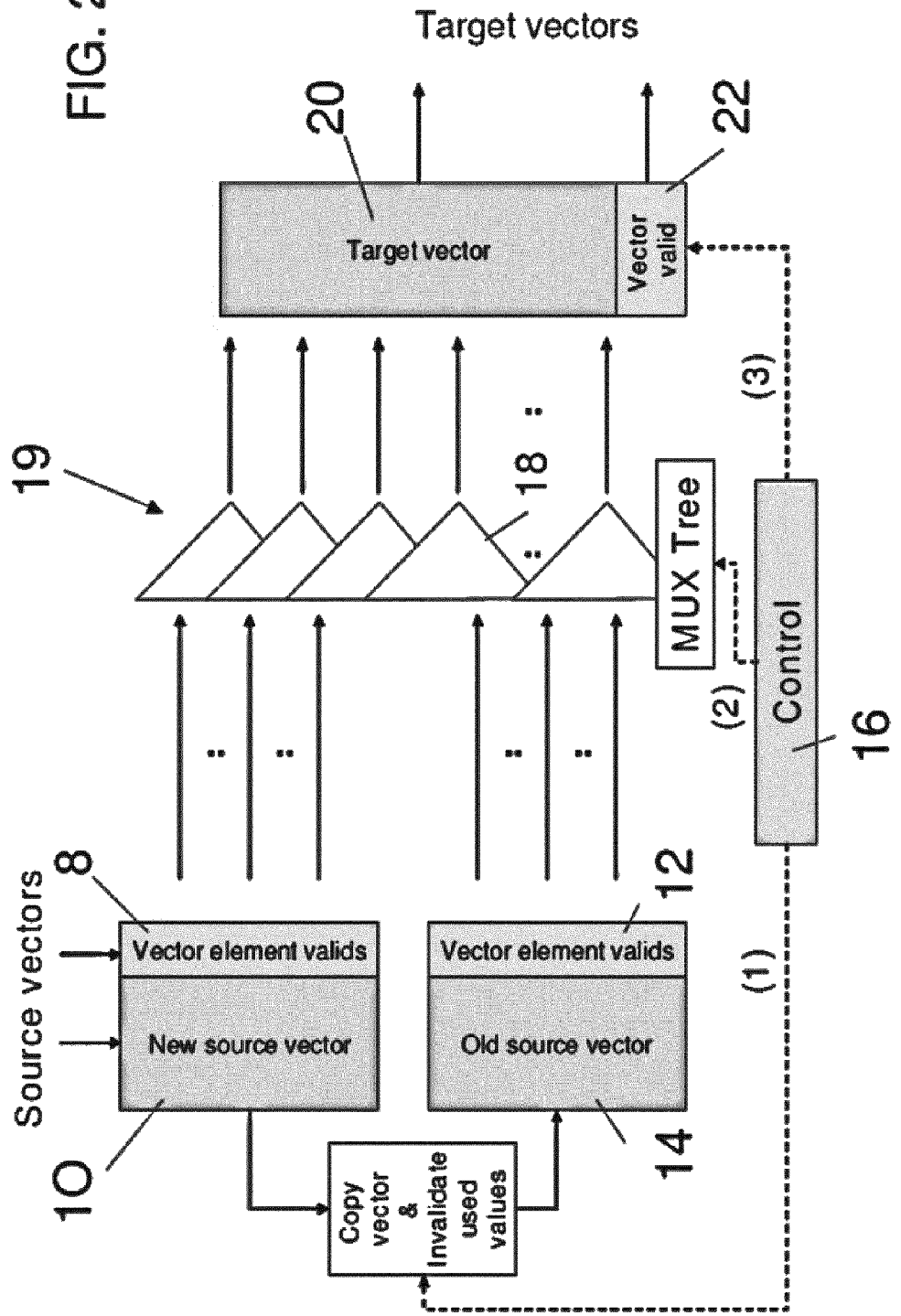
FIG. 2 illustrates a vector-based matching circuit in accordance with some embodiments of the present invention.

In a separate operation completely filled target address vectors are paired with the complete data vectors and outputted as composite vectors (not depicted in FIG. 2). The data vectors are stored in data memory, e.g. a multi-port memory, at addresses and the address vectors define the addresses of data to be output from the data memory.

In an implementation thereof, embodiments of the present invention involve collecting bus transactions in a buffer until there is enough valid addresses for a full transaction in parallel, and then directing these addresses towards a memory such as a multi-port memory 7 that stores the data. Embodiments of the present invention can be used within a device that processes (partial) vectors of data that arrive at a regular rate whereas embodiments of the present invention provide the address information to produce complete vectors of data at an irregular rate.

In some embodiments of the present invention the final output only consists of complete address vectors. When using a data memory such as a multi-bank memory, if more than one address in the completed address vector points to the same bank, an address collision would occur. The present invention is not limited by how bank collisions are to be resolved and such methods and devices lie outside the scope of the present invention.

In one embodiment of the present invention the total amount of input elements in all of the partial vectors is a multiple of P. A further embodiment of the present invention allows processing of a sequence of partial vectors of which the total amount of elements is not a multiple of P. In this case the matching circuit according to embodiments the present invention is responsive to an "end-of-session-flag" that flushes the accumulation buffer and forces the last vector to be partial as will be described with reference to FIG. 3, e.g. an incomplete vector may be flushed at time t=8.

An embodiment of a matching circuit of the present invention will be described with reference to FIG. 2.

In this embodiment, the matching circuit 4 includes buffers 8, 10, 12, 14 for a new source address vector (in buffer 10), for the validity indications for the new source address vector (in buffer 8), for a previous source address vector (in buffer 14), and for the validity indications for the old source address vector (in buffer 12). The valid address vector elements are transferred to a target address vector buffer 20 by means of a routing architecture 19 having for example multiplexers 18, under the control of a control unit 16. The target buffer 20 has an address vector validity buffer 22. In each cycle a new address vector and its element validity indicators are loaded into the relevant buffers 8, 10.

The operation of the matching circuit 4 can be broken down into three separate parts as depicted in FIG. 2:

1. "Copy Vector & Invalidate Used Values"

Regardless of how many valid address vector elements are available in the system, the matching circuit 4 is adapted so that the complete contents of "the old source address vector" in buffer 14 are consumed every clock cycle. For the "new source address vector" buffer 10, a certain number of elements are consumed depending on either (or both of) the number of valid address vector elements in "Old source address vector" buffer 14 or the "Target address vector" buffer 20. These elements need to be marked invalid and copied to "Old source address vector" buffer 14.

2. "MUX Tree Control"

To transfer the relevant valid address vector elements from the two source address vector buffers 10, 14 to the target address vector buffer 20, the routing infrastructure 19 comprising for example the multiplexers 18 needs to be set up correctly every clock cycle. The number of valid address vector elements in the different buffers 10, 14, 20 are used as input for this part of the control. The control is performed by the control unit. To provide the validity information feedback the control unit 16 communicates with the buffers 8, 10, 12, 14, 20, 22 and the routing.

3. "Vector Valid" Signaling

Every clock cycle the matching circuit 4 tries to assemble a complete target address vector. Whether or not this is possible depends on the number of valid address vector elements in "New source vector" buffer 10 and/or either (or both of) the number of valid address vector elements in "Old source address vector" buffer 14 or in the "Target vector" buffer 20. Whenever a complete target address vector is assembled the "Vector valid" bit will indicate this in the buffer 22. If the target address vector can only be assembled partially the "Vector invalid" bit will be set to indicate this instead. The vector valid indicator can be the absence of an indication whereas there is an indication if the vector is invalid. Alternatively, the vector invalid indicator can be the absence of an indication whereas there is an indication if the vector is valid. Thus, a single bit may suffice to indicate "Vector valid" or "Vector invalid". Alternatively, both the vector valid indicator and invalid indicator can be defined by the presence of different indications respectively. Thus, the vector valid indicator could be a bit having a Boolean value 1 or 0, and the invalid indicator would have the Boolean value 0 or 1, respectively.

A short example in terms of the number of valid vector elements shows how the matching circuit works.

In FIG. 3 is displayed the state of the system for a given time t. In the top left of every state square the number of valid address vector elements in the "New source address vector" buffer is indicated with in subscript the number of consumed valid address vector elements. In the bottom left the number of valid address vector elements in the "Old source address vector" buffer together with the consumption value is displayed. In the top right the number of address vector elements in the "Target address vector" is shown. This value corresponds with the sum of the number of address vector elements in the "Target address vector" of the time t=t−1 and the number of consumed address vector elements from the source buffers modulo $P_{out}$ (where $P_{out}$=8). The vector valid bit for the output vector will hence be set at t=1, 2, 3, 5, 6, 7. At t=0, 4, 8, 9 no vector will be output.

Figure 4:
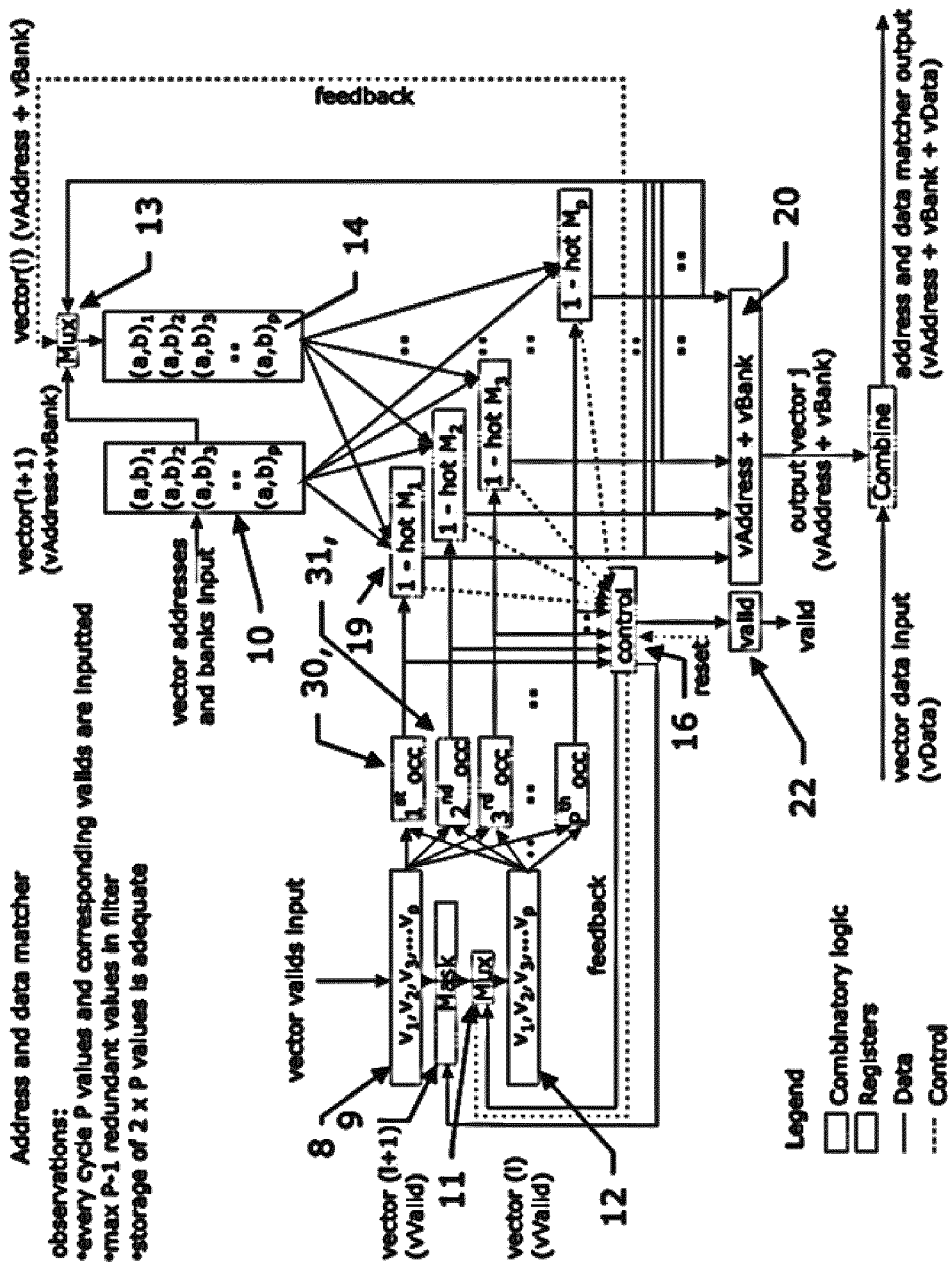
FIG. 4 illustrates a vector-based matching circuit in accordance with some embodiments of the present invention.

An embodiment of a matching circuit 4 is shown in FIG. 4. Every cycle, e.g. every clock cycle of a timing circuit (not shown) P values are input to buffer 10 and corresponding validity information for these P values is input into buffer 8. Corresponding data is also stored in a memory. Outputs of the logic elements "occurrence masks" (X-th Occ) 30, 31, . . . are OR-ed together to a single P-bit mask and output to the logic element "Mask". The logic element "Mask" XORs this mask with the valid elements of the new address vector in buffer 8 of that same cycle and stores this in buffer 12. The effect of this is that any valid elements in buffer 8 that have not been transferred to the target vector buffer 20 are stored into buffer 12 for transfer in the next cycle.

The X-th Occ logic elements 30, 31, . . . highlight the first bit equal to the Boolean value for a valid element (e.g. "1") of the input bit address vector in its output bit address vector, i.e. each valid bit. All other bits in the output address vector in buffer 20 are zero. In case there are no bits equal to the Boolean valid value (e.g. "1") in the input address vector, the whole output address vector in buffer 20 is zero.

In embodiments of the present invention, the routing architecture 19 includes multiplexer elements designated "1-hot mux" that are occurrence checkers and use a 1-hot bit vector (a bit vector in which exactly one bit is equal to the Boolean value that signifies it is valid, e.g. "1") to select one of its inputs. The routing architecture 19 including multiplexer elements "1-hot mux" is responsible for transferring the valid elements from the address vectors in buffers 10, 14 and 8, 12 respectively to the target address vector buffer 20 and validity buffer 22, respectively. All 1-hot match outputs of the 1-hot mux's are concatenated together and form a feedback signal to the multiplexers 11 and 13. Multiplexer 11 generates the XOR of the mask 9 with the valid elements of the new address vector in buffer 8 of that same cycle which is stored in buffer 12. The multiplexer 13 transfers the elements of buffer 10 to buffer 14 at the end of each cycle. The multiplexers 11 and 13 are initially set to accept the feedback signal. All the 1-hot match outputs of the 1-hot multiplexers are ANDed together and produce a one-bit valid signal that is sent to the validity buffer 22.

Whenever the validity buffer 22 is set to the Boolean value for complete validity of the address vector in buffer 20, the mulitplexers 11 and 13 are set to accept a new address vector. Whenever the validity buffer 22 is set to the Boolean value for invalidity of the address vector in buffer 20, the mulitplexers 11 and 13 are set to receive the feedback signal.

A combine function brings together the vector data and corresponding address and bank values for each data vector.

Figure 5B:
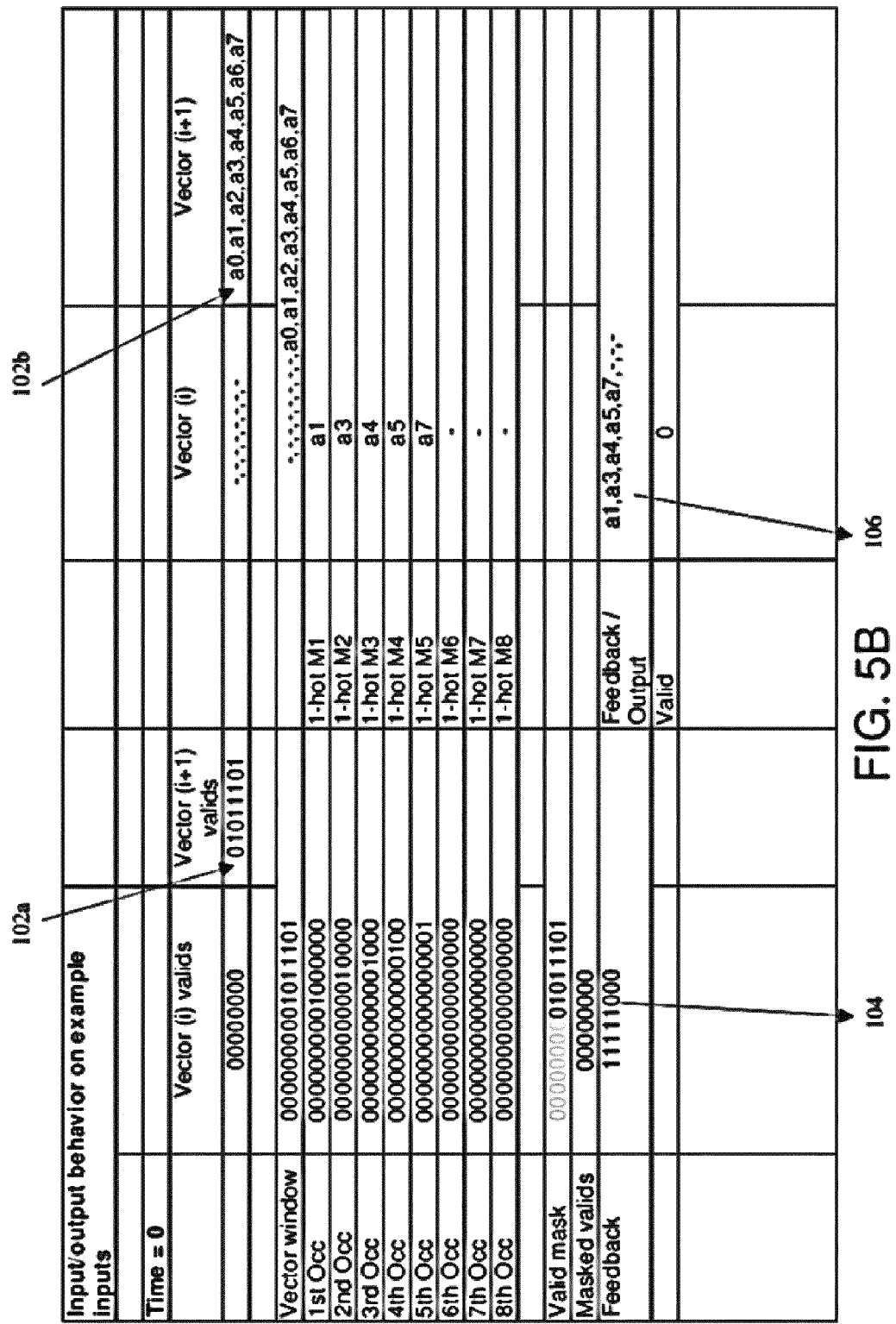

An exemplary process flow 100 is shown in FIGS. 5A to 5G which can be carried out, for example, with a circuit as described with reference to FIG. 4. FIG. 5A lists the address vectors and their corresponding validity indicators that are received at times Time=0 to Time=5 whereby the time interval can be, for example a clock cycle or a multiple thereof. FIGS. 5B to G show the status of the occurrence masks or checkers, the buffers, the validity indicators, the masks at each time step.

At each time the values for a new address vector ("Vectors") are received along with the corresponding validity indicators ("Valids"). In step 102 as shown in FIG. 5B, the valids (step 102a) and the address vector values (step 102b) are stored, e.g. loaded into the first validity buffer 8 and first address buffer 10 respectively. These correspond to the P values input to buffer 10 and corresponding validity information for these P values input into the buffer 8 as described above. Corresponding data is also stored in a memory. The first to P'th, (e.g. eighth if the number of elements in the vectors is 8) Occurrence Masks or checkers (X-th Occ) highlight the first bit equal to the Boolean value for a valid element, which in this case is a "1", of the input bit address vector. This bit is then placed in its output bit address vector, i.e. each valid bit.

A 1-hot bit vector is a bit vector in which exactly one bit is equal to the Boolean value that signifies it is valid, e.g. "1". For example, multiplexer elements "1-hot mux" shown in FIG. 4 use a 1-hot bit vector to select one of its inputs. Outputs of the logic elements "occurrence masks" for example occurrence checkers (X-th Occ) are OR-ed together to a single P-bit mask and output, e.g. to the logic element "Mask". This mask is XORed with the valid elements of the newly stored address vector, e.g. that is in the first validity buffer 8 of that same cycle and these are stored, e.g. in a second validity buffer 12. All 1-hot match outputs of the 1-hot mux's are concatenated together and form a feedback signal to the mask 9 shown as step 104 on FIGS. 5B and C. The XOR of the mask 9 with the valid elements of the new address vector in first validity buffer 8 of that same cycle is generated which is stored, e.g. in second validity buffer 12. The stored valid address vector elements, e.g. in a first address buffer 10 are transferred and stored, e.g. in a second address buffer 14 at the end of each cycle as shown by step 106 on FIGS. 5B and C. As shown in FIGS. 5B and C the feedback signal is accepted initially.

The effect of this is that any valid elements that have been stored, e.g. in first validity buffer 8, that have not been transferred to the target vector buffer 20 are stored, e.g. in the second validity buffer 12 for transfer in the next cycle. This is shown in FIG. 5C where 8 valid vector elements have been obtained, namely a1, a3, a4, a5, a7, b0, b1, b3 and these are the "output" in FIG. 5C. The feedback signal is all "1"=valid. The valid elements from the stored first and second address vectors, respectively are transferred to the target address vector buffer 20 and validity buffer 22, respectively. But vector element b5 is valid (masked valids in FIG. 5B is 00000001) but has to be transferred to the next cycle as is shown by step 108 in FIG. 5D.

All the 1-hot match outputs of the 1-hot multiplexers are ANDed together and produce a one-bit valid signal that is sent to the validity buffer 22.

Whenever the validity buffer 22 is set to the Boolean value for complete validity of the address vector in buffer 20, the mulitplexers 11 and 13 are set to accept a new address vector. This is shown in FIGS. 5C, 5D and 5G where the validity of the output is "1" and the feedback signal is all "1". The new vector is transferred with steps 110 and 112 (not shown in FIG. 5G).

Whenever the validity buffer 22 is set to the Boolean value for invalidity of the address vector in buffer 20, the mulitplexers 11 and 13 are set to receive the feedback signal. This is shown in FIGS. 5B, E and F where the validity of the output is "0" and the feedback signal is transferred in steps 104, 114, 116.

The address vector matching, e.g. for application in data block reordering according to a specific permutation such as can be found in interleaving, shuffling and scrambling processes can be implemented in hardware circuits, and/or some parts can be implemented in software in any computer language, run by conventional processing hardware such as a general purpose microprocessor, or application specific integrated circuits for example.

For example, the address vector matching, e.g. for application in data block reordering according to a specific permutation such as can be found in interleaving, shuffling and scrambling processes may be implemented according to embodiments of the present invention as hardware, computer software, or combinations of both. Such a system may include a general purpose processor, an embedded processor, an application specific integrated circuit (ASIC), a field programmable gate array (FPGA) or other programmable logic device, discrete gate or transistor logic, discrete hardware components, or any combination designed to perform the functions described herein. A processor may also be implemented as a combination of computing devices, e.g., a combination of an FPGA and a microprocessor, a plurality of microprocessors, one or more microprocessors in conjunction with an FPGA, or any other such configuration.

Figure 6:
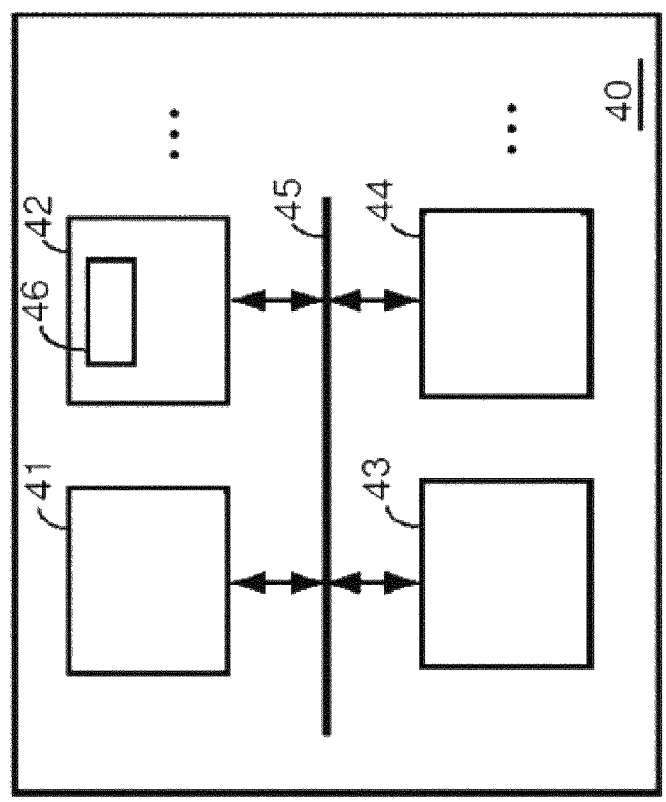
FIG. 6 is a schematic representation of a computer processing system that can be used with the present invention.

Embodiments of the present invention may also be realized on a processor system. The processing system may include a computing device or processing engine, e.g. a microprocessor. Any of the methods described above according to embodiments of the present invention or claimed may be implemented in a processing system 40 such as shown in FIG. 6. FIG. 6 shows one configuration of processing system 40 that includes at least one customizable or programmable processor 41 coupled to a memory subsystem 42 that includes at least one form of memory, e.g., RAM, ROM, and so forth. It is to be noted that the processor 41 or processors may be a general purpose, or a special purpose processor, and may be for inclusion in a device, e.g. a chip that has other components that perform other functions. Thus, one or more aspects of the method according to embodiments of the present invention can be implemented in digital electronic circuitry, or in computer hardware, firmware, software, or in combinations of them. The processing system may include a storage subsystem 43 that has at least one disk drive and/or CD-ROM drive and/or DVD drive. In some implementations, a display system, a keyboard, and a pointing device may be included as part of a user interface subsystem 44 to provide for a user to manually input information, such as parameter values. Ports for inputting and outputting data such as the address vector and validity data are included. More elements such as network connections, interfaces to various devices, and so forth, may be included, but are not illustrated in FIG. 6. The various elements of the processing system 40 may be coupled in various ways, including via a bus subsystem 45 shown in FIG. 6 for simplicity as a single bus, but which will be understood to those in the art to include a system of at least one bus. The memory of the memory subsystem 42 may at some time hold part or all (in either case shown as 46) of a set of instructions that when executed on the processing system 40 implement the steps of the method embodiments described herein.

Embodiments of the present invention also include a computer program product which provides the functionality of any of the methods according to the present invention when executed on a computing device such as a processing engine. Software according to the present invention, when executed on a processing engine, can contain code segments that execute a method of processing addresses for use in addressing a memory containing data to be reordered. The software may be adapted such that when executed on a processing engine a first at least partial address vector and first validity information indicating which elements of the first at least partial address vector are valid are stored. The software may be adapted to allow receiving of a sequence of address vectors comprising a second at least partial address vector and second validity information indicating which vector elements of the second at least partial address vector are valid.

The software may be adapted to allow transfer of a number of valid vector elements from the first and second at least partial address vectors to a target address vector while replacing the stored first at least partial address vector by storing any valid vector elements of the second at least partial address vector that have not been transferred, as the first at least partial address vector. The software may be adapted to allow outputting of the target vector if all of the vector elements of the target address vector are valid.

The software may be adapted to allow that all valid elements from the first at least partial address vector are transferred, while at least some of the valid elements from the second at least partial address vector are transferred.

The software may be adapted to allow one second at least partial address vector with its validity information indicating which vector elements of the second partial address vector are valid to be received per clock cycle.

The software may be adapted to allow the validity information of the first and second partial address vectors for the address vector elements that are to be transferred to the output vector to be directly or indirectly OR-ed together to a single mask and the single mask to be XORed with the validity information of the second address vector and to store the result as the validity information for the first address vector in the next cycle. If there are P elements in the vectors the mask is a P-bit mask.

In a specific embodiment of the present invention to indirect OR-ing, the software may be adapted to allow the validity information of the first and second at least partial address vectors for the address vector elements that are to be transferred to the output vector to be the validity information that is output from logic elements such as occurrence checkers. Hence it is the outputs of the occurrence checkers that are OR-ed together to the single bit mask. These occurrence checkers use validity information of the first and second at least partial address vectors as input.

The software may be adapted to allow, if all of the vector elements of the target address vector are valid, the vector elements of the second at least partial address vector to be stored as the first at least partial address vector for the next cycle.

The software may be adapted to allow, if all of the vector elements of the target address vector are not valid, the P-bit mask to be used to select the vector elements of the second at least partial address vector that are stored as the first address vector for the next cycle.

The software may be adapted to allow the validity information of the first and second at least partial address vectors for the vector elements that are to be transferred to the target address vector to be ANDed together and stored as validity information of the target address vector.

The software may be adapted so that the data to be reordered is reordered to a specific permutation.

Such a computer program product can be tangibly embodied in a carrier medium carrying machine-readable code for execution by a programmable processor. The present invention thus relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non-volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fiber optics, including the wires that comprise a bus within a computer.

Hence, embodiments of the present invention also provide a computer program product comprising a computer readable medium, having thereon a computer program comprising program instructions, the computer program being loadable into a data-processing unit and adapted to cause the data-processing unit to execute any of the method according to the present invention as described above the computer program is run by the data-processing unit.

Embodiments of the present invention also provide an arrangement adapted to address a memory containing data to be reordered, the arrangement comprising an address generator adapted to provide at least partial address vectors; and the logic circuit or data processing unit able to carry out any of the methods of the present invention.

Embodiments of the present invention also provide a telecommunications device such as a wireless communication device comprising the above arrangement as well as a for example a memory adapted to contain data to be reordered. The telecommunications device may be a receiver, a transmitter or a transceiver. A receiver may comprise an antenna, a radio frequency front end usually comprising a filter and a downconverter, an analog to digital converter, a timing and frequency synchronisation unit, a correction unit for any frequency and/or timing offset, a channel correction unit, a deinterleaver in accordance with any of the embodiments of the present invention and a decoder. A transmitter may comprise an antenna, a radio frequency front end usually comprising a power amplifier, a filter and an upconverter, an digital to analog converter, a timing and frequency synchronisation unit 5, a correction unit for any frequency and/or timing offset, a channel coding unit, an interleaver in accordance with any of the embodiments of the present invention and a coder, e.g. a source coder.

While the invention has been illustrated and described in detail in the drawings and foregoing description, such illustration and description are to be considered illustrative or exemplary and not restrictive; the invention is not limited to the disclosed embodiments.

The invention claimed is:

1. A method of processing addresses for addressing a memory containing data to be reordered, the method comprising:
   storing a first at least partial address vector and first validity information indicating which elements of the first at least partial address vector are valid,
   receiving a sequence of address vectors comprising a second at least partial address vector and second validity information indicating which vector elements of the second at least partial address vector are valid,
   transferring a number of valid vector elements from the first and second at least partial address vectors to a target address vector while replacing the stored first at least partial address vector by storing any valid vector elements of the second at least partial address vector that have not been transferred, as the first at least partial address vector, and
   outputting the target address vector if all of the vector elements of the target address vector are valid.

2. The method of claim 1, wherein all valid elements from the first at least
   partial address vector are transferred, and at least some of the valid elements from the second at least partial address vector are transferred.

3. The method of claim 1, wherein one second at least partial address vector with its validity information indicating which vector elements of the second at least partial address vector are valid is received per clock cycle.

4. The method of claim 3, wherein the validity information of the first and second at least partial address vectors for the address vector elements that are to be transferred to the output vector are directly or indirectly OR-ed together to a single mask and the single mask is XORed with the validity information of the second at least partial address vector and the result stored as the validity information for the first at least partial address vector in the next cycle.

5. The method of claim 3, wherein if all of the vector elements of the target address vector are valid, the vector elements of the second partial address vector are stored as the first at least partial address vector for the next cycle.

6. The method of claim 4, wherein if all of the vector elements of the target address vector are not valid, the single mask is used to select the vector elements of the second at least partial address vector that are stored as the first at least partial address vector for the next cycle.

7. The method of claim 3, wherein the validity information of the first and second at least partial address vectors for the vector elements that are to be transferred to the target address vector are ANDed together and stored as validity information of the target address vector.

8. A computer program product comprising a non-transitory computer readable medium, having thereon a computer program comprising program instructions, the computer program being loadable into a data-processing unit and adapted to cause the data-processing unit to execute the method according to claim 1 when the computer program is run by the data-processing unit.

9. A logic circuit adapted to process addresses for addressing a memory containing data to be reordered, the circuit comprising:
   a first and a second buffer adapted to store, respectively, a first at least partial address vector and first validity information indicating which elements of the first at least partial address vector are valid,
   a third and a fourth buffer adapted to store, respectively, a second at least partial address vector and second validity information indicating which vector elements of the second at least partial address vector are valid, and
   a routing unit adapted to transfer a number of valid vector elements from the first and third buffers to a fifth buffer adapted to store a target address vector and storing, in the first buffer, any valid address vector elements of the third buffer that have not been transferred from the third buffer.

10. The logic circuit of claim 9, wherein the logic circuit is adapted to receive one at least partial address vector with its validity information indicating which vector elements of the one at least partial address vector are valid per clock cycle.

11. The logic circuit of claim 10, wherein the logic circuit is adapted to directly or indirectly OR together validity information of the first and second at least partial address vectors for the vector elements that are to be transferred to the output vector to a single mask and to XOR the single mask with the validity information of the second at least partial address vector and to store the result in the second buffer as the validity information for the first at least partial address vector for the next cycle.

12. The logic circuit of claim 11, wherein the logic circuit is adapted such that if all of the vector elements of the target address vector are valid, to store in the first buffer vector elements of the second at least partial address vector as the first at least partial address vector for the next cycle or
   wherein the logic circuit is adapted to, if all of the vector elements of the target address vector are not valid, to use the single mask to select the vector elements of the second at least partial address vector and store them in the first buffer as the first at least partial address vector for the next cycle.

13. The logic circuit of claim 10, wherein the routing unit is adapted to AND together the validity information of the first and second at least partial address vectors for the vector elements that are to be transferred to the target address vector and to store these in a sixth buffer as validity information of the target address vector, and/or
   wherein the routing unit is adapted to transfer all valid elements from the first at least partial address vector and to transfer at least some of the valid elements from the second at least partial address vector.

14. An arrangement adapted to address a memory containing data to be reordered, the arrangement comprising:
   an address generator adapted to provide at least partial address vectors;
   the logic circuit according claim 9.

15. A wireless communication device comprising the arrangement of claim 14 and a memory adapted to contain data to be reordered.

* * * * *